United States Patent
Xu et al.

(10) Patent No.: US 9,502,557 B2
(45) Date of Patent: Nov. 22, 2016

(54) LDMOS FOR HIGH FREQUENCY POWER AMPLIFIERS

(71) Applicant: CoolStar Technology, Inc., Saratoga, CA (US)

(72) Inventors: Shuming Xu, San Mateo, CA (US); Wenhua Dai, San Jose, CA (US)

(73) Assignee: Coolstar Technology, Inc., Sunnyvale, CA (US)

( * ) Notice: Subject to any disclaimer, the term of this patent is extended or adjusted under 35 U.S.C. 154(b) by 0 days.

(21) Appl. No.: 14/848,263

(22) Filed: Sep. 8, 2015

(65) Prior Publication Data

US 2016/0071975 A1   Mar. 10, 2016

Related U.S. Application Data

(60) Provisional application No. 62/047,585, filed on Sep. 8, 2014.

(51) Int. Cl.
*H01L 29/78* (2006.01)
*H01L 29/40* (2006.01)

(52) U.S. Cl.
CPC ......... *H01L 29/7835* (2013.01); *H01L 29/402* (2013.01)

(58) Field of Classification Search
CPC ........... H01L 29/7816; H01L 29/7831; H01L 29/7855; H01L 29/0611
See application file for complete search history.

(56) References Cited

U.S. PATENT DOCUMENTS

| | | | | |
|---|---|---|---|---|
| 7,608,513 B2* | 10/2009 | Yang | ................... | H01L 29/7835 257/E21.427 |
| 2006/0113601 A1* | 6/2006 | Shibib | ................... | H01L 29/402 257/365 |

\* cited by examiner

*Primary Examiner* — Roy Potter
*Assistant Examiner* — Paul Patton
(74) *Attorney, Agent, or Firm* — Otterstedt, Ellenbogen & Kammer, LLP

(57) ABSTRACT

An LDMOSFET is designed with dual modes. At the high voltage mode, it supports a high breakdown voltage and is biased at a high voltage to get the benefits of high output power, higher output impedance and lower matching loss. At the low voltage mode, it exhibits a reduced knee voltage so that some extra voltage and power can be gained although it is biased at lower voltage. The efficiency is therefore improved as well.

15 Claims, 2 Drawing Sheets

LDMOS FOR HIGH FREQUENCY POWER AMPLIFIERS

CROSS-REFERENCE TO RELATED APPLICATION(S)

This application claims priority under 35 U.S.C. §119(e) to U.S. Provisional Patent Application Ser. No. 62/047,585, "LDMOSFET with Dual Gate," filed Sep. 8, 2014.

BACKGROUND

1. Technical Field

The present disclosure relates to power devices and, more specifically, to power devices with high frequency capabilities.

2. Description of the Related Arts

For mobile applications, such as smart phones and tablets, RF power amplifiers (PA) are used. Besides high efficiency and high linearity, it is desirable to have a PA with low thermal resistance, excellent connection of source to ground and good shielding.

High frequency power amplifiers are dominated by devices based on wide band gap material substrates, such as GaAs. One advantage of a GaAs substrate as compared to silicon is higher carrier mobility and lower parasitic capacitance. One drawback for GaAs devices is that it is not compatible with main stream silicon process. So it is difficult to integrate a GaAs PA with other devices on the same die, which limits the performance of the system. In addition, the GaAs substrate is a semi-insulator, which has relatively poor thermal conductivity.

CMOS technology is well developed and in a very advanced mature stage for production. It is desired to develop RF PA based on CMOS technology. However, the low breakdown voltage of CMOS technology limits the power capability of CMOS and the high parasitic capacitance limits its high frequency capability. To make up the high voltage requirement for PA, a few NMOS devices are connected to each other. Unfortunately, this decreases the current capability and increases the parasitic capacitance resulting in an even worse performance. Moreover, the SOI layer isolates the heat transfer to the substrate, which degrades the PA's performance.

SUMMARY

It is desired to have a MOSFET with a high breakdown voltage and a low knee voltage. In one aspect, an LDMOSFET is designed with dual modes. At the high voltage mode, it supports a high breakdown voltage and is biased at a high voltage to get the benefits of high output power, higher output impedance and lower matching loss. At the low voltage mode, it exhibits a reduced knee voltage so that some extra voltage and power can be gained although it is biased at lower voltage. The efficiency is therefore improved as well. Other aspects include devices, components, systems, applications, improvements, variations, modifications, methods, processes and other technologies related to the foregoing.

DETAILED DESCRIPTION

The Figures (FIG.) and the following description relate to embodiments of the present disclosure by way of illustration only. The features and advantages described in the specification are not all inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles of the embodiments of the disclosure described herein.

Low drain to source capacitance can prevent RF PAs' output from being shunt for mobile applications when operating frequencies are high, for example, in the Gigahertz range. It is desired to have a MOSFET with high breakdown voltage and low knee voltage. But, in general, the knee voltage increases with higher breakdown voltage. In other words, a high voltage device suffers from a higher knee voltage. To maintain high break down voltages and improve RF PAs' operation efficiency, it is desired to have dual-voltage mode LDMOSFET so that RF PAs' knee voltages can be reduced at the low voltage mode and high output power can be maintained at the high voltage mode.

Figure 1:
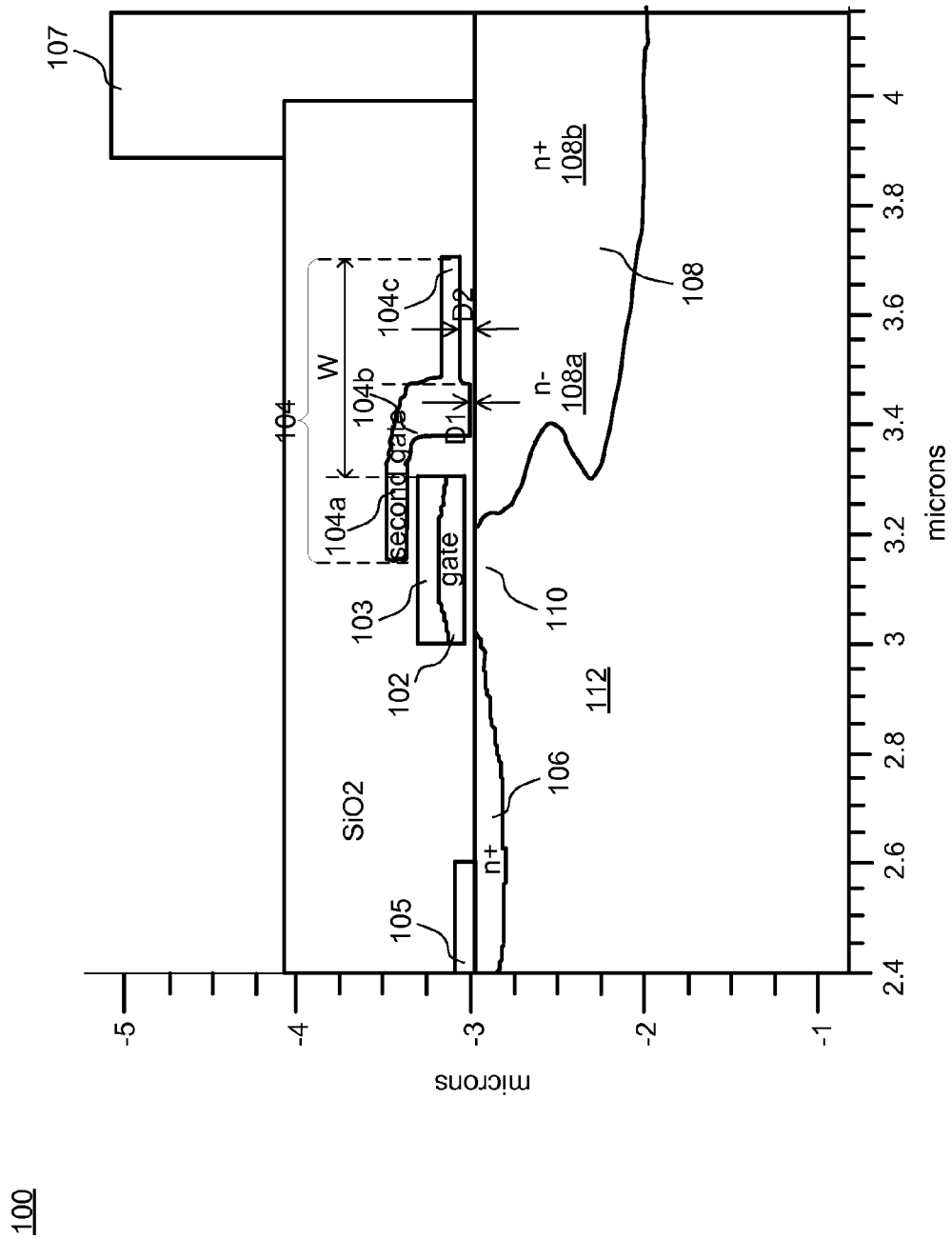
FIG. 1 is a cross-sectional view of an example dual-mode LDMOSFET, according to one embodiment.

FIG. 1 is a cross-sectional view of an example dual-mode LDMOSFET 100, according to one embodiment. The dual-mode LDMOSFET 100 can operate as an RF PA to amplify RF signals at different levels with high efficiency without degrading its linear operation. In addition, the dual-mode LDMOSFET 100 can sustain a high breakdown voltage. When the input of the dual-mode LDMOSFET 100 has a lower power (i.e., the input RF signals are low), the dual-mode LDMOSFET 100 operates at a low-voltage operation mode with a low knee voltage to maintain the output efficiency. When the input of the dual-mode LDMOSFET 100 has a higher power (i.e., the input RF signals are higher), the dual-mode LDMOSFET 100 operates at a high-voltage operation mode to ensure its linearity thereby to increase its output power capability, and also to sustain high voltages. In addition, the LDMOSFET 100 has a higher output impedance resulting in lower matching losses.

The dual-mode LDMOSFET 100 includes a first gate 102, a second gate 104, a source comprising a source region 106, a drain comprising a drain region 108, a pwell region 112, and a substrate (not shown). The first gate 102 controls the device's channel resistance. The second gate 104 controls the resistance between the drain and the channel of the LDMOSFET 100, and therefore modulates the knee voltage of the device. The second gate 104 provides control over the electric field and hot carrier injection from the first gate corner and therefore also provides control over the breakdown voltage of the LDMOSFET 100. The drain region includes a lightly doped n− region 108a and a heavily doped n+ region 108b. The heavily doped n+ region 108b contacts the lightly doped n− region and the drain electrode 107. The lightly doped n− region 108a is located between the source region 106 and the heavily doped n+ region 108b, but is separated from the source region 106 by a pwell region 112. The source region 106 is in the pwell region 112 and contacts the source electrode 105. The first gate 102 is positioned to regulate a channel in the pwell region 112. Applying voltages of different levels to the first gate 102 can control the channel 110 between the source region 106 and the lightly doped n− region 108a. Applying voltages of different levels to the second gate 104 can regulate at which operation mode the dual-mode LDMOSFET 100 operates. The first gate 102 is based on tungsten silicide (WSix) and is insulated from the channel 110 by a silicon oxide ($SiO_2$) layer. The first gate 102 comprises a layer of tungsten 103, which improves the conductivity of the overall gate. The gate oxide between the tungsten silicide first gate 102 and the channel 110 is around 10 nm.

The second gate 104 can be made of highly doped polysilicon or silicide polysilicon. In this example, it comprises a first portion 104a that overlaps with the first gate 102, which is insulated from first gate 102 (e.g., the tungsten 103) by a gate oxide of about 5-15 nm. The second gate 104 comprises a second portion 104b and a third portion 104c both of which overlap with the lightly doped section 108a. The second portion 104b and the top surface of the lightly doped section 108a are separated by a gap, of which the distance $D_1$ is in the range of 10-30 nm. The third portion 104c and the top surface of the lightly doped section 108a are separated by a gap, of which the distance $D_2$ is about 10-50 nm. The total width of the second and third portions 104b and 104c is between 0.2-0.5 micron.

In a different variation, the second portion 104b and the third portion 104c are separated from the top surface of the lightly doped section 108a by a gap of constant size, for example a gap of which the distance is in the range of 10-30 nm.

The second gate 104 is configured to control the resistance between the drain region 108 and the channel 110. When the dual-mode LDMOSFET 100 operates at a high-voltage operation mode, the second gate 104 is grounded to reduce the electric field strength in the lightly doped section 108a. In addition, the first gate 102 is shielded by the second gate 104. At the high-voltage operation mode when the second gate 104 is grounded, hot carrier injection at the gate corner is reduced. Accordingly, the dual-mode LDMOSFET 100 has a higher breakdown voltage.

At the low-voltage operation mode, the second gate 104 is positively biased to regulate the accumulation of carriers in the lightly doped section 108a, thereby reducing the knee voltage of the dual-mode LDMOSFET 100. The positive voltage applied to the second gate 104 introduces carrier accumulation in the lightly doped section 108a and thereby effectively reduces the knee voltage and prevents the device from entering the saturation region. Accordingly, the operation efficiency of the dual-mode LDMOSFET 100 is increased.

The device's output power can be determined according to Equation (1):

$$P_{out} = \frac{(V_{cc} - V_k)^2}{2R_L}, \quad (1)$$

where $P_{out}$ is the output power, $V_{cc}$ is the supply voltage, $V_k$ is the knee voltage, and $R_L$ is the output resistance.

Figure 2:
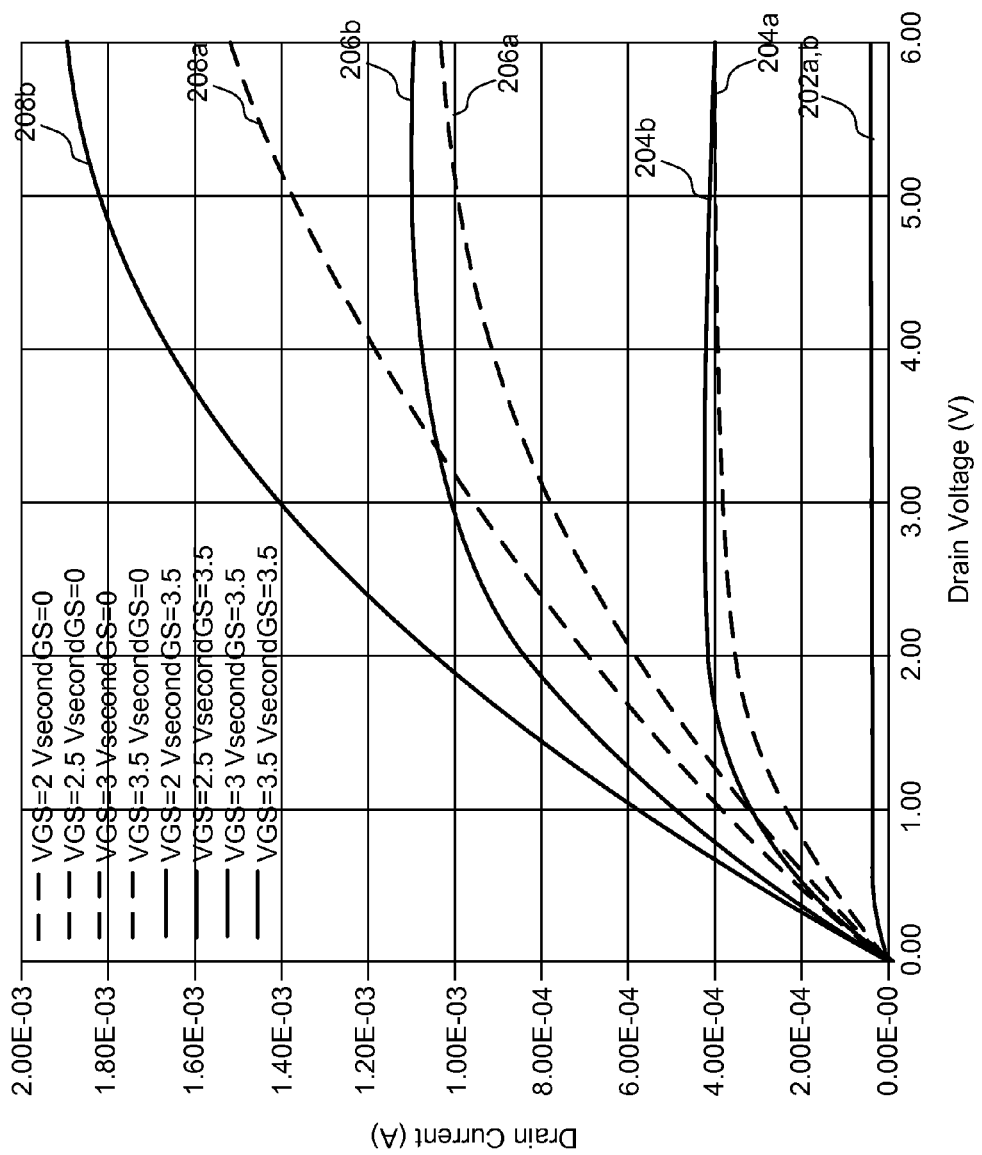
FIG. 2 illustrates a direct current (DC) drain current to voltage (IV) diagram of an example dual-mode LDMOS-FET, according to one embodiment.

FIG. 2 illustrates the two modes. FIG. 2 is a direct current (DC) drain current to voltage (I-V) diagram of an example dual-mode LDMOSFET, according to one embodiment. The dashed curves, which are labelled 20xa, are the I-V curves for the high-voltage operation mode (0V applied to second gate 104). The solid curves, which are labelled 20xb, are the I-V curves for the low-voltage operation mode (3.5V applied to second gate 104). In FIG. 2, VGS is the voltage applied to the first gate 102, and VsecondGS is the voltage applied to the second gate 104.

Each set of curves includes four curves, biased at different voltages for the first gate 102. For the high-voltage operation mode, the curves 202a, 204a, 206a, 208a are biased at 2V, 2.5V, 3V and 3.5V for the first gate 102, respectively. For the low-voltage operation mode, the curves 202b, 204b, 206b, 208b are biased at 2V, 2.5V, 3V and 3.5V for the first gate 102, respectively. Note that curves 202a and 202b are overlapping. As illustrated, at low-voltage operation mode, the device's knee voltage $V_k$ can be reduced by biasing the second gate 104 with a higher voltage and the device's output power capability can be increased according to Equation (1). At high-voltage operation mode, biasing the second gate 104 with a lower voltage reduces the effects of hot carrier injection and increases the device's breakdown voltage.

Upon reading this disclosure, those of skill in the art will appreciate still additional alternative designs for providing adaptive envelope tracking bias voltages to radio frequency power amplifiers. Thus, while particular embodiments and applications of the present disclosure have been illustrated and described, it is to be understood that the disclosure is not limited to the precise construction and components disclosed herein and that various modifications, changes and variations which will be apparent to those skilled in the art may be made in the arrangement, operation and details of the method and apparatus of the present disclosure disclosed herein without departing from the spirit and scope of the disclosure.

What is claimed is:

1. An LDMOSFET comprising:
   a source comprising an n+ source region in a laterally diffused pwell, the n+ source region contacting a source electrode;
   a drain comprising an n− drain region lateral to an n+ drain region, the n+ drain region contacting a drain electrode, the n− drain region located between the n+ source region and the n+ drain region but separated from the n+ source region by the pwell;
   a first gate positioned to regulate a channel in the pwell, the channel between the n+ source region and the n− drain region;
   a first gate oxide layer formed under the first gate, the first gate oxide layer having a first thickness associated therewith;
   a second gate positioned to regulate a resistance of the n− drain region; and
   a second gate oxide layer formed under the second gate, the second gate oxide layer having a second thickness under a first portion of the second gate and having a third thickness under a second portion of the second gate, the second and third thicknesses being different relative to one another.

2. The LDMOSFET of claim 1, wherein the first gate comprises tungsten silicide.

3. The LDMOSFET of claim 2, wherein the first gate further contacts a tungsten layer.

4. The LDMOSFET of claim 1, wherein the second gate comprises highly doped polysilicon or silicide polysilicon.

5. The LDMOSFET of claim 1, wherein the LDMOSFET is operable in at least two different voltage modes by changing a voltage applied to the second gate.

6. The LDMOSFET of claim 5, wherein a higher voltage is applied to the second gate when an input of the LDMOSFET has a lower power and the LDMOSFET is operated in a low-voltage mode.

7. The LDMOSFET of claim 6, wherein applying the higher voltage to the second gate increases carrier accumulation in the n− drain region.

8. The LDMOSFET of claim 5, wherein a ground voltage is applied to the second gate when the input of the LDMOSFET has a higher power and the LDMOSFET is operated in a high-voltage mode.

9. The LDMOSFET of claim 8, wherein applying the ground voltage to the second gate reduces hot carrier injection from a corner of the first gate.

10. The LDMOSFET of claim 8, wherein applying the ground voltage to the second gate increases a breakdown voltage of the LDMOSFET.

11. The LDMOSFET of claim 5, wherein applying a higher voltage to the second gate reduces a knee voltage for the drain I-V curve of the LDMOSFET.

12. The LDMOSFET of claim 5, wherein the LDMOSFET is operable in only two different voltage modes by changing a voltage applied to the second gate between a higher voltage and a lower voltage.

13. The LDMOSFET of claim 1, wherein the second gate comprises a first portion separated from the n− drain region by a first distance and a second portion separated from the n-drain region by a second distance, and wherein the first distance is between 10-30 nm and the second distance is between 10-50 nm.

14. The LDMOSFET of claim 1, wherein the second gate comprises a portion separated from the n− drain region by a first distance, and wherein the first distance is between 10-30 nm.

15. The LDMOSFET of claim 1, wherein the first thickness of the first gate oxide layer and the second and third thicknesses of the second gate oxide layer are all different relative to one another.

* * * * *